(12) United States Patent
Hodono

(10) Patent No.: US 8,142,672 B2
(45) Date of Patent: Mar. 27, 2012

(54) MANUFACTURING METHOD OF OPTO-ELECTRIC HYBRID BOARD

(75) Inventor: Masayuki Hodono, Ibaraki (JP)

(73) Assignee: Nitto Denko Corporation, Ibaraki-shi, Osaka (JP)

(*) Notice: Subject to any disclaimer, the term of this patent is extended or adjusted under 35 U.S.C. 154(b) by 508 days.

(21) Appl. No.: 12/428,669

(22) Filed: Apr. 23, 2009

(65) Prior Publication Data
US 2009/0269704 A1    Oct. 29, 2009

Related U.S. Application Data

(60) Provisional application No. 61/055,507, filed on May 23, 2008.

(30) Foreign Application Priority Data

Apr. 24, 2008 (JP) .................................. 2008-114329

(51) Int. Cl.
B29D 11/00 (2006.01)

(52) U.S. Cl. ............................................. 216/24; 216/2

(58) Field of Classification Search ................ 216/2, 24, 216/13
See application file for complete search history.

(56) References Cited

U.S. PATENT DOCUMENTS

| | | | |
|---|---|---|---|
| 6,804,423 B2 | 10/2004 | Tsukamoto et al. | |
| 7,163,598 B2 | 1/2007 | Okubora et al. | |
| 7,306,689 B2 | 12/2007 | Okubora et al. | |
| 2002/0074308 A1* | 6/2002 | Beguin | 216/2 |
| 2007/0170603 A1 | 7/2007 | Takahashi et al. | |
| 2007/0223935 A1 | 9/2007 | Asai et al. | |

FOREIGN PATENT DOCUMENTS

| | | |
|---|---|---|
| EP | 1359441 A1 | 11/2003 |
| EP | 1811823 A1 | 7/2007 |
| JP | 2000-298217 A | 10/2000 |
| JP | 2006-030798 A | 2/2006 |
| JP | 2000-199827 A | 7/2008 |

OTHER PUBLICATIONS

European Search Report dated Aug. 13, 2009, issued in corresponding European Patent Application No. 09158611.5.
Chinese Office Action dated Nov. 30, 2011, issued in corresponding Chinese Patent Application No. 200910135371.
Japanese Office Action dated Jan. 31, 2012, issued in corresponding Japanese Patent Application No. 2008-114329.

* cited by examiner

Primary Examiner — Roberts Culbert
(74) Attorney, Agent, or Firm — Westerman, Hattori, Daniels & Adrian, LLP

(57) ABSTRACT

An opto-electric hybrid board manufacturing method which improves the alignment accuracy of an optical element with respect to a core of an optical waveguide. When a core (7) of an optical waveguide (W) is formed on a surface of an electric circuit board (E), the core (7) and optical element positioning alignment marks (A) are simultaneously formed from a photosensitive resin layer including a core formation region and an alignment mark formation region by a single photolithography process. In an optical element mounting step, a light emitting element (11) and a light receiving element (12) are mounted at proper positions with respect to the core (7) of the optical waveguide (W) with reference to the alignment marks (A).

6 Claims, 5 Drawing Sheets

MANUFACTURING METHOD OF OPTO-ELECTRIC HYBRID BOARD

RELATED APPLICATIONS

This application claims the benefit of U.S. Provisional Application No. 61/055,507, filed May 23, 2008, which is hereby incorporated by reference.

BACKGROUND OF THE INVENTION

1. Field of the Invention

The present invention relates to a manufacturing method of an opto-electric hybrid board including an optical waveguide and an electric circuit mounted with an optical element.

2. Description of the Related Art

Conventionally, an opto-electric hybrid board is produced by separately preparing an electric circuit board and an optical waveguide and then bonding the electric circuit board and the optical waveguide to each other with an adhesive. As shown in FIG. 6, the opto-electric hybrid board includes, for example, an electric circuit board 81 including a multi-level electric circuit 83, and an optical waveguide 80 including an under-cladding layer 86, a core 87 and an over-cladding layer 88 and bonded onto the electric circuit board 81 with an adhesive 82. A light emitting element 11 and a light receiving element 12 are mounted on mount pads provided on the electric circuit board 81 (as parts of the electric circuit 83) by a flip-chip mounting method (see, for example, Japanese Patent Application Laid-Open No. 2000-199827). In the opto-electric hybrid board shown in FIG. 6, the light emitting element 11 and the light receiving element 12 are respectively positioned at opposite end portions of the optical waveguide 80 on the front side. The opposite end portions of the optical waveguide 80 each have a tilt surface tilted at 45 degrees with respect to the optical axis. A portion of the core 87 present in the tilt surface serves as a light path deflection mirror 87a. In FIG. 6, a reference character 11a denotes electrodes (bumps) of the light emitting element 11, and a reference character 12a denotes electrodes (bumps) of the light receiving element 12.

In the opto-electric hybrid board, a light beam L is transmitted in the following manner. First, the light beam L is emitted downward from the light emitting element 11. The light beam L passes through the over-cladding layer 88 at one of the opposite end portions (at a left end portion in FIG. 6) of the optical waveguide 80 to be inputted into one of opposite ends of the core 87. Then, the light beam L is reflected (deflected 90 degrees) on the light path deflection mirror 87a at the one end of the core 87, and travels axially of the core 87. The light beam L is transmitted through the core 87 to reach the other end (a right end in FIG. 6) of the core 87. Subsequently, the light beam L is reflected upward (deflected 90 degrees) on the light path deflection mirror 87a at the other end, and passes through the over-cladding layer 88 to be outputted and received by the light receiving element 12.

In practice, when the electric circuit board 81 and the optical waveguide 80 are bonded to each other with the adhesive 82 in the production of the opto-electric hybrid board of Japanese Patent Application Laid-Open No. 2000-199827, the electrical circuit board 81 and the optical waveguide 80 are slightly offset from each other due to the fluidity of the adhesive 82 by a pressure applied thereto for the bonding. Therefore, even if the light emitting element 11 and the light receiving element 12 are accurately mounted on the electric circuit board 81 by detecting the mount pads of the electric circuit board 81, the light emitting element 11 and the light receiving element 12 are positioned with respect to the light path deflection mirrors 87a at the opposite ends of the core 87 of the optical waveguide 80 with a reduced alignment (positioning) accuracy because of the offset of the electric circuit board 81. In this state, the light beam L is transmitted with the optical axes of the light emitting element 11 and the light receiving element 12 being misaligned with the light path deflection mirrors 87a at the opposite ends of the core 87, so that a light coupling loss is increased.

In view of the foregoing, it is an object of the present invention to provide an opto-electric hybrid board manufacturing method which improves the alignment accuracy of an optical element with respect to a core of an optical waveguide.

To achieve the object described above, the inventive opto-electric hybrid board manufacturing method includes the steps of: preparing an electric circuit board; fabricating an optical waveguide by forming an optical waveguide formation photosensitive resin layer on a surface opposite from a circuit formation surface of the electric circuit board and patterning a core formation region of the photosensitive resin layer by a photolithography method to form a core having a predetermined pattern; mounting an optical element on a part of the circuit formation surface of the electric circuit board in association with an end of the optical waveguide; forming a reflection portion on an end portion of the core located at the end of the optical waveguide, the reflection portion serving to reflect a light beam to permit light transmission between the core and the optical element; and forming a passage in the electric circuit board for the light transmission between the core and the optical element; wherein a photosensitive resin layer including an alignment mark formation region in addition to the core formation region is used as the photosensitive resin layer, and the alignment mark formation region is patterned by the photolithography method to form an alignment mark having a predetermined pattern simultaneously with the formation of the core in the optical waveguide fabricating step; wherein the optical element is mounted at a predetermined position with reference to the alignment mark in the optical element mounting step.

In the inventive opto-electric hybrid board manufacturing method, the photosensitive resin layer having the core formation region and the alignment mark formation region is formed on the surface opposite from the circuit formation surface of the electric circuit board, and the photosensitive resin layer is patterned once by the photolithography method to simultaneously form the core and the optical element positioning alignment mark. Thus, the optical waveguide is fabricated from the photosensitive resin layer. Therefore, there is no need to use an adhesive for bonding the optical waveguide to the electric circuit board, thereby eliminating the drawback associated with the offset which may otherwise occur when the adhesive is used. At the same time, the core can be positioned in predetermined positional relation with respect to the alignment mark. Since the mounting of the optical element is achieved with reference to the alignment mark in the present invention, it is possible to mount the optical element in proper positional relation with respect to the core of the optical waveguide. As a result, the light coupling loss occurring between the optical element and the light reflection portion at the end of the core can be minimized on the opto-electric hybrid board thus produced.

DETAILED DESCRIPTION OF THE INVENTION

Embodiments of the present invention will hereinafter be described in detail with reference to the attached drawings.

Figure 1:
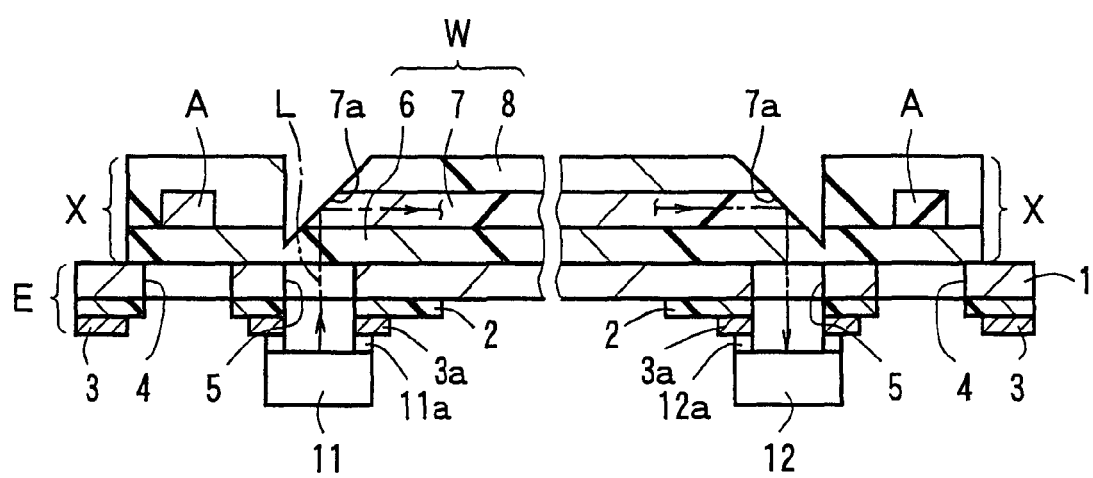
FIG. 1 is a sectional view schematically illustrating an opto-electric hybrid board produced by an opto-electric hybrid board manufacturing method according to a first embodiment of the present invention.

FIG. 1 illustrates an opto-electric hybrid board produced by an opto-electric hybrid board manufacturing method according to a first embodiment of the present invention. The opto-electric hybrid board includes an electric circuit board E having an electric circuit 3, and an optical waveguide W provided on a surface (front surface) of the electric circuit board E opposite from an electric circuit formation surface (back surface) on which the electric circuit 3 is provided. A light emitting element 11 and a light receiving element 12 are respectively provided on parts of the electric circuit formation surface of the electric circuit board E in association with opposite ends of the optical waveguide W. The electric circuit board E is configured such that the electric circuit 3 is provided on a back surface of a stainless steel substrate 1 with the intervention of an insulation film 2. The electric circuit 3 includes mount pads 3a on which the light emitting element 11 and the light receiving element 12 are mounted. On the other hand, the optical waveguide W includes an under-cladding layer 6 provided on the front surface of the electric circuit board E, a core 7 formed by forming a photosensitive resin layer on the under-cladding layer 6 and processing the photosensitive resin layer, and an over-cladding layer provided over the core 7. As shown, right and left end portions of the optical waveguide w respectively have tilt surfaces tilted at 45 degrees with respect to the stainless steel substrate 1. End portions of the core 7 present in the tilt surfaces each serve as a light reflection portion 7a. Triple-layered structures X each composed of the same materials as the optical waveguide W are respectively provided on right and left sides of the optical waveguide W. Intermediate layers of the layered structures X are composed of the same material as the core 7, and each serve as an alignment mark A. The stainless steel substrate 1 has through-holes 5 provided in portions thereof located below the light reflection portions 7a at the opposite ends of the core 7 for light transmission between the core and the light emitting element 11 and between the core and the light receiving element 12. Further, the stainless steel substrate 1 has through-holes 4 provided in portions thereof located below the alignment marks A for visual detection of the alignment marks A from the back side thereof. The light emitting element 11 is mounted on one of the mount pads 3a below one of the light reflection portions 7a provided at one of the opposite ends (a left end in FIG. 1) of the core 7, while the light receiving element 12 is mounted on the other mount pad 3a below the other light reflection portion 7a provided at the other end (a right end in FIG. 1) of the core 7.

The light reflection portions 7a at the opposite ends of the core 7 reflect a light beam L for light transmission between the core 7 and the light emitting element 11 and between the core 7 and the light receiving element 12. In the opto-electric hybrid board, the light emitting element 11 is an optical element that emits the light beam L toward the light reflection portion 7a at the one end of the core 7. The light beam L emitted from the light emitting element 11 passes through the corresponding light transmission through-hole 5 of the stainless steel substrate 1 and then through the under-cladding layer 4 at the one end of the optical waveguide W, and is inputted into the one end portion of the core 7. In turn, the light beam L is reflected on the light reflection portion 7a at the one end of the core 7, and travels axially of the core 7. Then, the light beam L is transmitted through the core 7 to reach the light reflection portion 7a at the other end of the core 7. Subsequently, the light beam L is reflected downward on the light reflection portion 7a at the other end, and passes through the under-cladding layer 6 to be outputted. The outputted light beam L passes through the corresponding light transmission through-hole 5 of the stainless steel substrate 1, and then received by the light receiving element 12.

Figure 2:
FIGS. 2(a) to 2(c) are explanatory diagrams schematically showing an electric circuit board producing step in the opto-electric hybrid board manufacturing method according to the first embodiment of the present invention.
Figure 2:
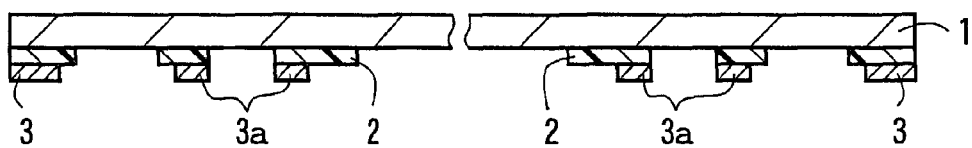
Figure 2:
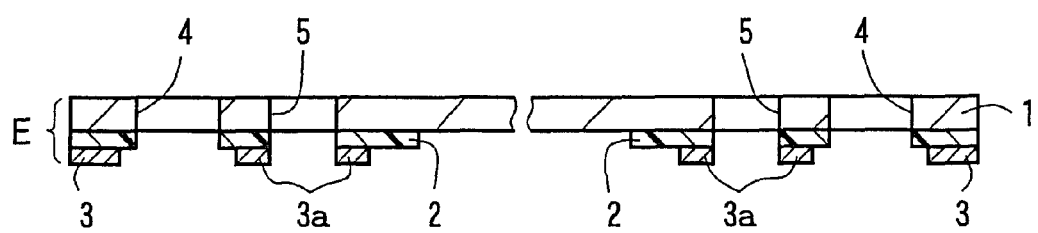

The opto-electric hybrid board according to this embodiment is produced through the following steps (1) to (4):

(1) The step of producing the electric circuit board E by forming the electric circuit 3 on the back surface of the stainless steel substrate 1 (see FIGS. 2(a) to 2(c));

(2) The step of fabricating the optical waveguide W on the front surface of the stainless steel substrate 1 of the electric circuit board E (see FIGS. 3(a) to 3(d));

(3) The step of forming the light reflection portions 7a at the opposite ends of the core 7 of the optical waveguide W (see FIG. 4); and (4) The step of mounting the light emitting element 11 and the light receiving element 12 on the electric circuit 3 (see FIG. 1).

The electric circuit board producing step (1) will be described. In this embodiment, the stainless steel substrate 1 (see FIG. 2(a)) is first prepared. The stainless steel substrate 1 (see FIG. 2(a)) typically has a thickness of 20 to 200 μm.

Then, as shown in FIG. 2(a), the insulation layer 2 is formed in a predetermined pattern on a predetermined portion of the back surface of the stainless steel substrate 1 by a photolithography method. The insulation layer 2 is formed so as not to cover portions of the stainless steel substrate 1 in which the through-holes 4 for the visual detection of the alignment marks A and the through-holes 5 for the light transmission are to be formed in the subsequent step (see FIG. 2(c)). The formation of the insulation layer 2 is achieved in the following manner. First, a photosensitive resin such as a photosensitive polyimide resin or a photosensitive epoxy resin is applied on the predetermined portion of the back surface of the stainless steel substrate 1 (facing up during the formation of the insulation layer 2) to form a photosensitive resin layer. Then, the photosensitive resin layer is exposed to radiation via a photomask having an opening pattern conformal to the pattern of the insulation layer 2. In turn, a development process is performed with the use of a developing solution, whereby an unexposed portion of the photosensitive resin layer is dissolved away. A remaining portion of the photosensitive resin layer has the pattern of the insulation layer 2. Thereafter, the developing solution is removed from the remaining photosensitive resin layer portion by a heat treatment. Thus, the remaining photosensitive resin layer portion is defined as the insulation layer 2. The insulation layer 2 typically has a thickness of 5 to 15 μm.

Subsequently, as shown in FIG. 2(b), the electric circuit 3 including the mount pads 3a is formed in a predetermined pattern on a surface of the insulation layer 2. The formation of the electric circuit 3 is achieved in the following manner. First, a metal layer (having a thickness of about 600 to about 2600 Å) is formed over the surface of the insulation layer 2 (facing up during the formation of the electric circuit 3) by sputtering, electrolytic plating or the like. The metal layer serves as a seed layer for the subsequent electrolytic plating (or a base layer for formation of an electrolytic plating layer). In turn, dry resist films are applied onto opposite surfaces of the resulting layered structure including the stainless steel substrate 1, the insulation layer 2 and the metal layer (seed layer), and then a slit is formed in a pattern conformal to the pattern of the electric circuit 3 in one of the dry resist films applied on the side of the metal layer by the photolithography method. Thus, a surface portion of the metal layer is exposed in the bottom of the slit. Then, the electrolytic plating layer is formed (as having a thickness of about 5 to about 20 μm) on the surface portion of the metal layer exposed in the bottom of the slit. In turn, the dry resist films are removed with the use of a sodium hydroxide aqueous solution or the like. Thereafter, a portion of the metal layer not formed with the electrolytic plating layer is removed by soft etching. The resulting layered structure including the electrolytic plating layer and a portion of the metal layer underlying the electrolytic plating layer is defined as the electric circuit 3.

Then, as shown in FIG. 2(c), the through-holes 4 for the visual detection of the alignment marks A and the through-holes 5 for the light transmission are formed at predetermined positions in the stainless steel substrate 1. The alignment mark visual detection through-holes 4 are formed at positions (two positions) in association with the alignment marks A to be formed in the vicinity of the opposite ends of the core 7 in the subsequent optical waveguide fabricating step, while the light transmission through-holes 5 are formed at positions (two positions) in association with the opposite ends of the core 7. The formation of the through-holes 4, 5 is achieved in the following manner. First, dry resist films are applied on opposite surfaces of the resulting layered structure including the stainless steel substrate 1, the insulation layer 2 and the electric circuit 3, and holes are formed in the pattern of the through-holes 4, 5 in one of the dry resist films by the photolithography method, whereby portions of the surface of the stainless steel substrate 1 are exposed in the bottoms of the holes. Then, the portions of the stainless steel substrate 1 exposed in the bottoms of the holes are etched away with a ferric chloride aqueous solution. Thus, the through-holes 4 for the visual detection of the alignment marks A and the through-holes 5 for the light transmission are formed. The alignment mark visual detection through-holes 4 typically each have a diameter of 0.1 to 3.0 mm, while the light transmission through-holes 5 typically each have a diameter of 0.05 to 0.2 mm. However, the diameters of the through-holes 4, 5 depend upon the sizes of the alignment marks A, the design of the light emitting element 11 and the like and, therefore, are not necessarily required to fall within the aforementioned ranges. Thus, the electric circuit board producing step (1) is completed.

Figure 3:
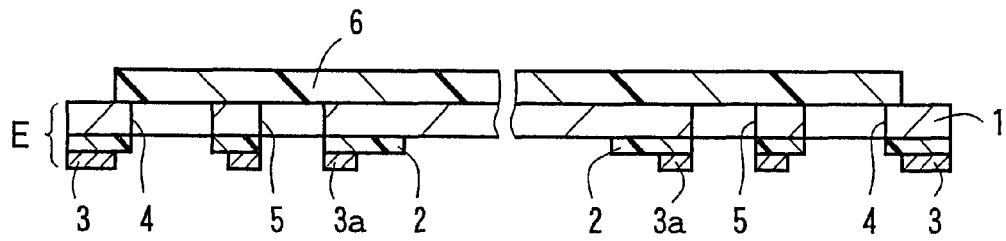
FIGS. 3(a) to 3(d) are explanatory diagrams schematically showing an optical waveguide fabricating step subsequent to the electric circuit board producing step.
Figure 3:
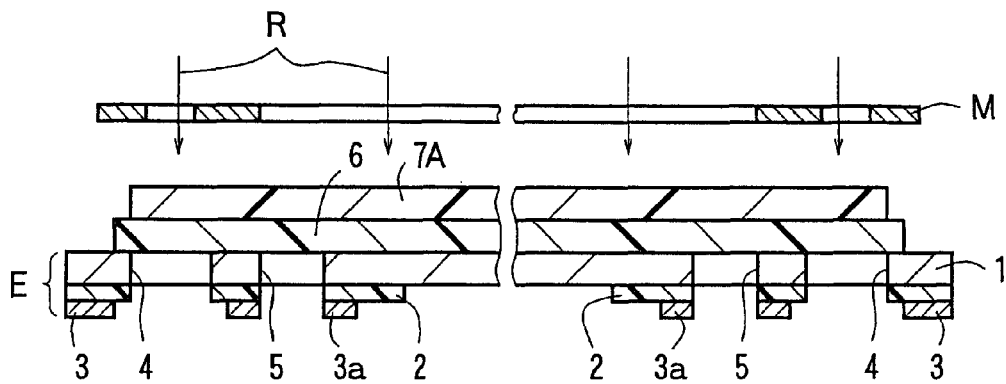
Figure 3:
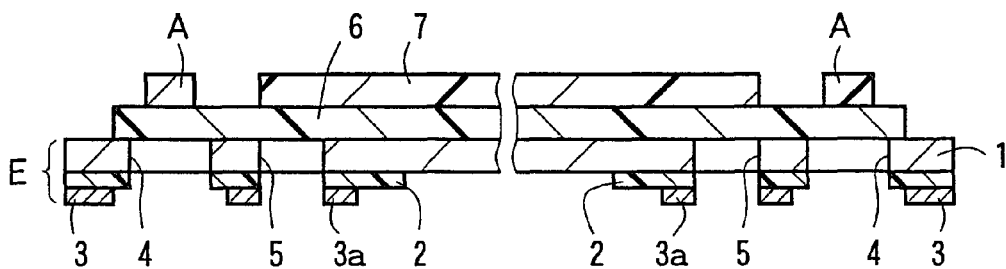
Figure 3:
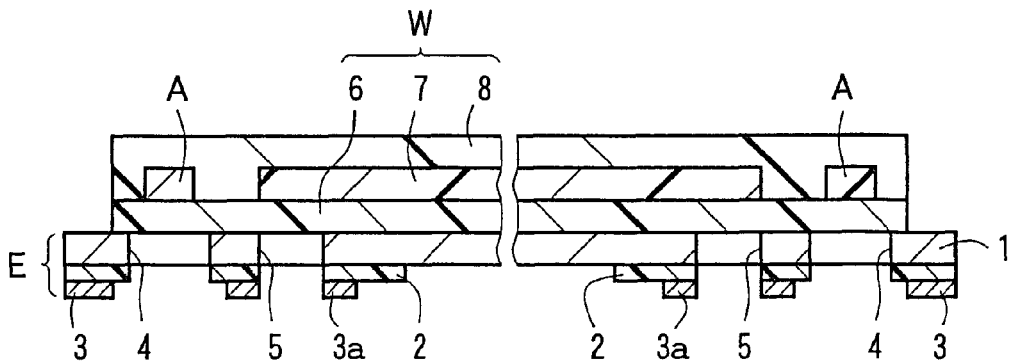

The optical waveguide fabricating step (2) subsequent to the electric circuit board producing step (1) will be described. In this embodiment, as shown in FIG. 3(a), the under-cladding layer 6 is formed in a predetermined pattern on a predetermined portion of the front surface of the stainless steel substrate 1 by the photolithography method. The formation of the under-cladding layer 6 is achieved in the following manner. First, a varnish prepared by dissolving a photosensitive resin such as a photosensitive polyimide resin or a photosensitive epoxy resin as a material for the under-cladding layer 6 in a solvent is applied on the predetermined portion of the front surface of the stainless steel substrate 1 and, as required, heat-treated (at 50° C. to 120° C. for about 10 to about 30 minutes) to be dried. Thus, a photosensitive resin layer for the formation of the under-cladding layer 6 is formed. In turn, the photosensitive resin layer is exposed to radiation via a photomask having an opening pattern conformal to the pattern of the under-cladding layer 6. Then, a development process is performed with the use of a developing solution, whereby an unexposed portion of the photosensitive resin layer is dissolved away. A remaining portion of the photosensitive resin layer has the pattern of the under-cladding layer 6. Thereafter, the developing solution is removed from the remaining photosensitive resin layer portion by a heat treatment. Thus, the remaining photosensitive resin layer portion is defined as the under-cladding layer 6. The under-cladding layer 6 typically has a thickness of 5 to 50 μm.

Then, as shown in FIGS. 3(b) and 3(c), the core 7 and the optical element positioning alignment marks A are simultaneously formed in a predetermined pattern on a predetermined portion of a surface of the under-cladding layer 6 from a photosensitive resin layer 7A having a core formation region and alignment mark formation regions by a single photolithography process. This is one feature of the present invention. In the present invention, the optical element positioning alignment marks A are formed simultaneously with the core 7 as described above, whereby the light emitting element 11 and the light receiving element 12 can be mounted at proper positions with respect to the core 7 of the optical waveguide W with reference to the alignment marks A in the subsequent step (4) of mounting the optical elements (the light emitting element 11 and the light receiving element 12).

In this embodiment, the alignment marks A are respectively formed in the vicinity of the opposite ends of the core 7. More specifically, the formation of the core 7 and the alignment marks A is achieved in the following manner. First, as shown in FIG. 3(b), a varnish prepared by dissolving a photosensitive resin as a material for the core 7 and the alignment marks A in a solvent is applied on the predetermined portion of the surface of the under-cladding layer 6 and, as required, heat-treated (at 50° C. to 120° C. for about 10 to about 30 minutes) to be dried. Thus, a photosensitive resin layer 7A for the formation of the core 7 and the alignment marks A is formed. In turn, the photosensitive resin layer is exposed to radiation R via a photomask M having an opening pattern conformal to the pattern of the core 7 and the alignment marks A, and then a development process and a heat treatment are performed as in the formation of the under-cladding layer 6. Thus, as shown in FIG. 3(c), the core 7 and the alignment marks A are formed in the predetermined pattern by the photolithography method. In this embodiment, the alignment marks A are positioned above the alignment mark visual detection through-holes 4, and the opposite ends of the core are positioned above the light transmission through-holes 5. The core 7 typically has a thickness of 5 to 60 μm and a width of 5 to 60 μm. The alignment marks A typically each have a cross shape as seen in plan, a thickness of 5 to 60 μm, a cross line width of 0.02 to 0.2 mm, a cross length of 0.2 to 1.0 mm, and a cross width of 0.2 to 1.0 mm. Examples of the material for the core 7 and the alignment marks A include the photosensitive resins described for the under-cladding layer 6. The material for the core 7 and the alignment marks A has a greater refractive index than the material for the under-cladding layer 6 and a material for the over-cladding layer 8 to be described later. The refractive index may be adjusted, for example, by selection of the types of the materials for the under-cladding layer 6, the core 7 (including the alignment marks A) and the over-cladding layer 8 and adjustment of the composition ratio thereof.

Subsequently, as shown in FIG. 3(d), the over-cladding layer 8 is formed in a predetermined pattern on a surface of the under-cladding layer 6 as covering the core 7 and the alignment marks A. The formation of the over-cladding layer 8 is achieved in the following manner. First, a varnish prepared by dissolving a photosensitive resin as a material for the over-cladding layer 8 in a solvent is applied over the core 7 and, as required, heat-treated (at 50° C. to 120° C. for about 10 to about 30 minutes) to be dried. Thus, a photosensitive resin layer for the formation of the over-cladding layer 8 is formed. In turn, the over-cladding layer 8 is formed in the predetermined pattern from the photosensitive resin layer by the photolithography method employing a photomask having an opening pattern conformal to the pattern of the over-cladding layer 8. The over-cladding layer 8 typically has a thickness of 10 to 2000 μm. Examples of the material for the over-cladding layer 8 include the photosensitive reins described for the under-cladding layer 6. Thus, the optical waveguide fabricating step (2) is completed.

Figure 4:
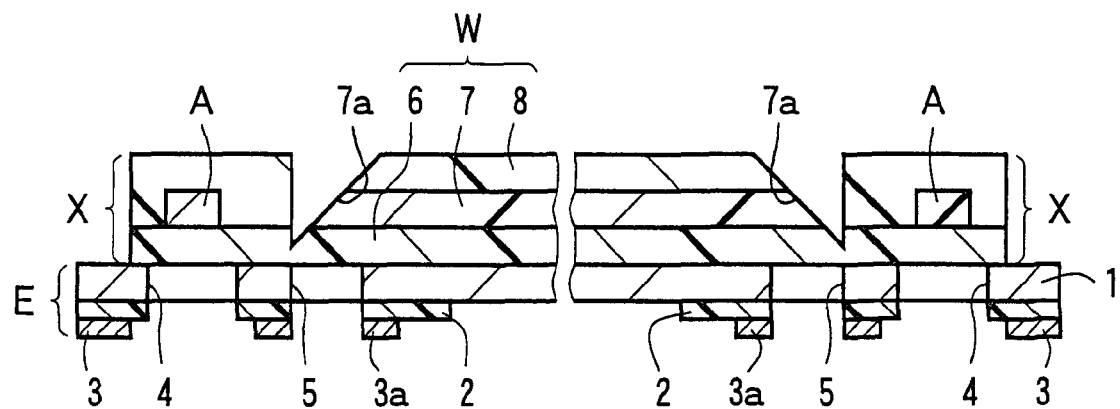
FIG. 4 is an explanatory diagram schematically showing a light reflection portion forming step subsequent to the optical waveguide fabricating step.

The light reflection portion forming step (3) subsequent to the optical waveguide fabricating step (2) will be described. For formation of the light reflecting portions 7a, as shown in FIG. 4, the opposite end portions of the optical waveguide W including the opposite ends of the core 7 are cut by laser processing or with the use of a rotary blade having a cutting edge angle of 45 degrees to be thereby formed with the tilt surfaces tilted at 45 degrees with respect to the stainless steel substrate 1. Portions of the core 7 present in the tilt surfaces are defined as the light reflection portions (light path deflection mirrors) 7a. Light impinging on the light reflection portions 7a is mostly reflected on the light reflection portions 7a, because the core 7 has a refractive index that is greater than the refractive index of air present around the light reflection portions 7a. Since the optical waveguide W has the tilt surfaces at its opposite end portions, the triple-layered structures X each having the alignment mark A as its intermediate layer are provided at the opposite ends of the optical waveguide W. Thus, the light reflection portion forming step (3) is completed.

The optical element mounting step (4) subsequent to the light reflection portion forming step (3) will be described. The optical elements (the light emitting element 11 and the light receiving element 12) are mounted in the following manner. The resulting intermediate product formed with the light reflection portions 7a is set on a stage of a mounting machine with its electric circuit 3 facing up. One of the alignment marks A (e.g., the left alignment mark A) is visually detected (read) through the under-cladding layer 6 and the corresponding alignment mark visual detection through-hole 4 by an image detecting device provided in the mounting machine. Thus, the mounting machine computes the position of the light reflection portion 7a at the one end of the core 7 adjacent to the one alignment mark A with reference to the one alignment mark A. Then, as shown in FIG. 1, one of the optical elements (e.g., the light emitting element 11) is mounted on the corresponding mount pad 3a to cover a lower portion of the corresponding light transmission through-hole 5 with its optical axis being aligned with the computed position of the light reflection portion 7a. Similarly, the other alignment mark A (e.g., the right alignment mark A) is used as a positioning reference for mounting the other optical element (e.g., the light receiving element 12). An example of the light emitting element 11 is a VCSEL (vertical cavity surface emitting laser), and an example of the light receiving element 12 is a PD (photodiode). Another feature of the present invention is that the light emitting element 11 and the light receiving element 12 are mounted at the predetermined positions with reference to the alignment marks A. In FIG. 1, a reference character 11a denotes electrodes (bumps) of the light emitting element 11, and a reference character 12a denotes electrodes (bumps) of the light receiving element 12.

The mounting of the light emitting element 11 and the light receiving element 12 is achieved by a flip-chip method, a solder reflow method, a C4 bonding method employing solder bumps and screen-printing of a solder paste, or the like. Particularly, a flip-chip method utilizing ultrasonic waves or heating is preferred, because the positional offset during the mounting can be reduced. A flip-chip method utilizing ultrasonic waves is more preferred, because thermal damage on the stainless steel substrate 1 can be prevented. Thus, the optical element mounting step (4) is completed to provide the intended opto-electric hybrid board.

In the inventive opto-electric hybrid board manufacturing method, the photosensitive resin layer 7A as the material for the core 7 (see FIG. 3(b)) is formed on the surface of the electric circuit board E, and the alignment mark formation regions are defined in the photosensitive resin layer 7A. Then, the core 7 and the alignment marks A for the positioning of the light emitting element 11 and the light receiving element 12 are simultaneously formed from the photosensitive resin layer 7A by the single photolithography process. In turn, the light emitting element 11 and the light receiving element 12 are mounted at the predetermined positions with reference to the alignment marks A. This improves the alignment accuracy of the light emitting element 11 and the light receiving element 12 with respect to the core 7 of the optical waveguide W. As a result, light coupling losses occurring between the light reflection portions 7a provided at the opposite ends of the core 7 and the light emitting and receiving elements 11, 12 are minimized in the opto-electric hybrid board thus produced.

In the embodiment described above, the substrate 1 is composed of stainless steel and, hence, is excellent in thermal elongation resistance. Therefore, the positional relationship between the alignment mark visual detection through-holes 4 and the light transmission through-holes 5 formed in the stainless steel substrate 1, and the dimensions of the optical waveguide W fabricated on the stainless steel substrate 1 are generally maintained as designed. That is, the stainless steel substrate 1 is advantageous for improving the accuracy in aligning the light emitting element 11 and the light receiving element 12 with respect to the light reflection portions 7a provided at the opposite ends of the core 7 with reference to the alignment marks A.

A substrate composed of other metal material or a resin material may be used instead of the stainless steel substrate 1. Where the substrate 1 is insulative, the electric circuit 3 may be formed directly on the substrate 1 without the formation of the insulation layer 2. The insulation layer 2 is employed for preventing a short circuit between the electric circuit 3 and the electrically conductive substrate 1 such as the aforementioned metal substrate 1.

In the embodiment described above, the under-cladding layer 6 is formed, but the core 7 and the alignment marks A may be formed directly on the surface of the substrate 1 such as the stainless steel substrate 1 without the formation of the under-cladding layer 6.

Figure 5:
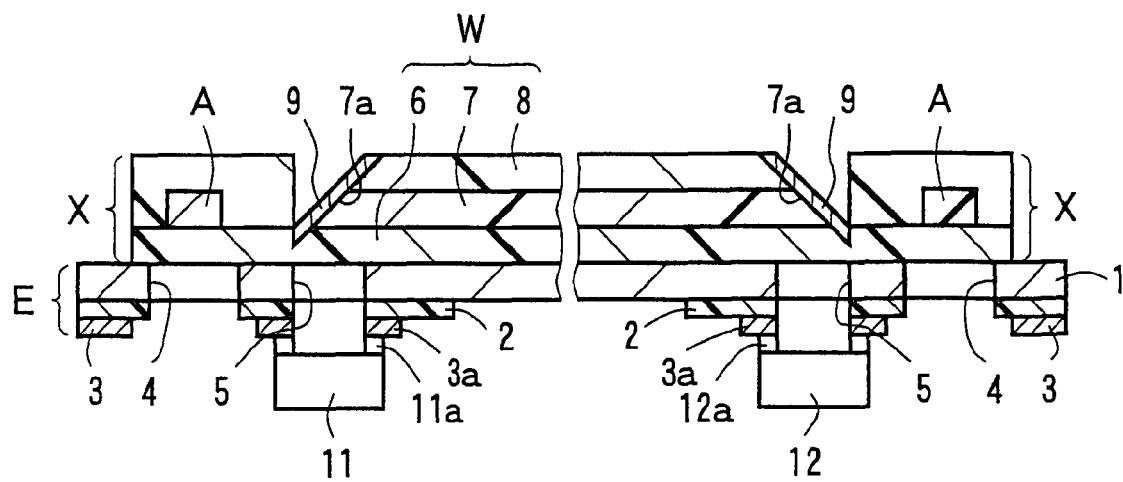
FIG. 5 is an explanatory diagram schematically showing an opto-electric hybrid board manufacturing method according to a second embodiment of the present invention.
Figure 6:
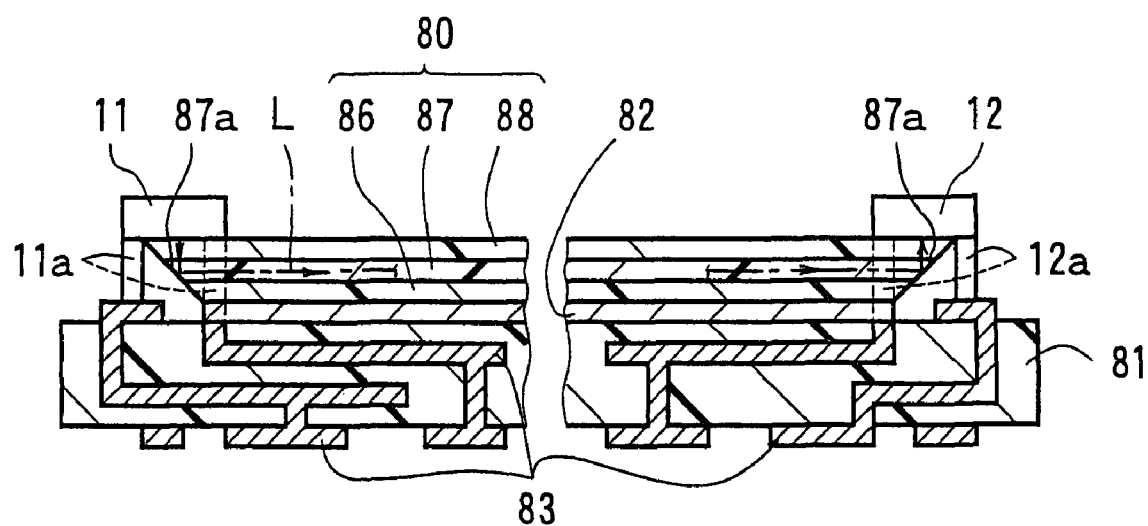
FIG. 6 is an explanatory diagram schematically showing a prior-art opto-electric hybrid board.

FIG. 5 shows an opto-electric hybrid board manufacturing method according to a second embodiment of the present invention. In this embodiment, the step of forming metal films 9 on the tilt surfaces at the opposite end portions of the optical waveguide W by plating or vapor deposition is added to the manufacturing method of the first embodiment. In an opto-electric hybrid board produced by this method, outer surfaces of the light reflection portions 7a are respectively covered with the metal films 9, so that the light reflection portions 7a each have a higher light reflectivity. This increases the light transmission efficiency. The second embodiment is arranged in substantially the same manner as the first embodiment except for the aforementioned point, and like components will be denoted by like reference characters.

The formation of the metal films 9 is achieved by plating or vapor deposition with a portion of the opto-electric hybrid board except for the tilt surfaces at the opposite end portions of the optical waveguide W being masked with a resist layer (with only the tilt surfaces being exposed). Thereafter, the resist layer is removed. The metal films 9 each have a thickness of, for example, 50 nm to 5 μm. Exemplary materials for the metal films 9 include nickel, copper, silver, gold, chromium, aluminum, zinc, tin, cobalt, tungsten, platinum, palladium, and alloys containing two or more of these elements. The formation of the metal layers 9 precedes the mounting of the light emitting element 11 and the light receiving element 12.

Next, an inventive example will be described. However, it should be understood that the present invention be not limited to the example.

Example

Production of Electric Circuit Board

An insulation layer of a photosensitive polyimide resin (having a thickness of 10 μm) was formed in a predetermined pattern on one surface of a stainless steel substrate (a SUS304 foil having a thickness of 20 μm) by the photolithography method. In turn, a seed layer of a copper/nickel/chromium alloy was formed on a surface of the insulation layer by sputtering. After dry resist films were applied on opposite surfaces of the resulting layered structure including the stainless steel substrate, the insulation layer and the seed layer, a slit conformal to the pattern of an electric circuit including mount pads was formed in one of the dry resist films on the side of the seed layer by the photolithography method. Thus, a surface portion of the seed layer was exposed in the bottom of the slit. Then, an electrolytic plating layer (having a thickness of 20 μm) was formed on the surface portion of the seed layer exposed in the bottom of the slit by electrolytic plating. In turn, the dry resist films were removed with the use of a sodium hydroxide aqueous solution. Thereafter, a portion of the seed layer not formed with the electrolytic plating layer was removed by soft etching. The resulting layered structure including the electrolytic plating layer and a portion of the seed layer underlying the electrolytic plating layer was defined as the electric circuit. Further, dry resist films were applied on opposite surfaces of the resulting layered structure including the stainless steel substrate, the insulation layer and the electric circuit, and then holes conformal to the pattern of alignment mark visual detection through-holes and light transmission through-holes were formed in one of the dry resist films by the photolithography method, whereby portions of the surface of the stainless steel substrate were exposed in the bottoms of the holes. Then, the portions of the stainless steel substrate exposed in the bottoms of the holes were etched away with the use of a ferric chloride aqueous solution. Thus, the two alignment mark visual detection through-holes and the two light transmission through-holes were formed in the stainless steel substrate. Thereafter, gold/nickel alloy plating layers were formed on surfaces of the mount pads.

Under-Cladding Layer Material and Over-Cladding Layer Material

An under-cladding layer material and an over-cladding layer material were prepared by mixing 35 parts by weight of bisphenoxyethanolfluorene glycidyl ether (Component A) represented by the following general formula (1), 40 parts by weight of 3',4'-epoxycyclohexylmethyl-3,4-epoxycyclohexane carboxylate which is an alicyclic epoxy resin(CELLOXIDE 2021P manufactured by Daicel Chemical Industries, Ltd.) (Component B), 25 parts by weight of (3',4'-epoxycyclohexane)methyl-3',4'-epoxycyclohexyl-carboxylate (CELLOXIDE 2081 manufactured by Daicel Chemical Industries, Ltd.) (Component C), and 2 parts by weight of a 50% propione carbonate solution of 4,4'-bis[di(β-hydroxyethoxy)phenylsulfinio]phenylsulfide bishexafluoroantimonate (Component D).

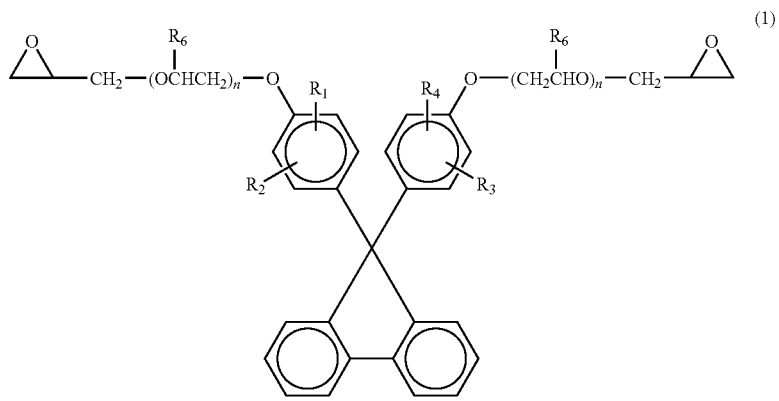

wherein $R_1$ to $R_6$ are hydrogen atoms, and n=1.

Core Material

A core material was prepared by dissolving 70 parts by weight of Component A, 30 parts by weight of 1,3,3-tris{4-[2-(3-oxetanyl)]butoxyphenyl}butane and 1 part by weight of Component D in ethyl lactate.

Fabrication of Optical Waveguide

The under-cladding layer material was applied on the other surface (a surface opposite from the electric circuit) of the stainless steel substrate to form a coating layer. Thereafter, the entire surface of the coating layer was exposed to radiation at a cumulative dose of 1000 mJ/cm² (based on an i-line standard) with the use of an ultra-high-pressure mercury-vapor lamp. Thus, the coating layer was cured. In turn, the coating layer was baked (heat-treated) at 120° C. for 15 minutes for dissipation of a generated acid, whereby a reaction was completed. In this manner, an under-cladding layer (having a thickness of 10 μm) was formed.

After the core material was applied on a surface of the under-cladding layer, the resulting layer was baked at 70° C. for 5 minutes for evaporation of the solvent. Thus, a photosensitive resin layer for formation of a core was formed. In turn, a photomask having an opening pattern conformal to the pattern of the core and alignment marks to be formed was positioned above the photosensitive resin layer so as to align the alignment marks with the alignment mark visual detection through-holes and align end portions of the core with the light transmission through-holes. Then, the photosensitive resin layer was exposed to radiation at a cumulative dose of 2000 mJ/cm$^2$ (based on an i-line standard) via the photomask. Thus, exposed portions of the photosensitive resin layer were cured. In turn, the photosensitive resin layer was baked (heat-treated) at 120° C. for 15 minutes for dissipation of a generated acid, whereby a reaction was completed. Subsequently, an unexposed portion of the photosensitive resin layer was dissolved away by rinsing (developing) with a γ-butyrolactone aqueous solution (developing solution). Thereafter, the exposed photosensitive resin layer portions were baked at 120° C. for 15 minutes. Thus, the core (having a width of 50 μm and a height of 50 μm) and cross-shaped alignment marks (having a cross line width of 0.05 mm, a cross length of 0.5 mm, a cross width of 0.5 mm and a height of 50 μm) were formed.

Subsequently, the over-cladding layer material was applied on the resulting substrate as covering the core to form a coating layer. Thereafter, the entire surface of the coating layer was exposed to radiation at a cumulative dose of 1000 mJ/cm$^2$ (based on an i-line standard) with the use of an ultra-high-pressure mercury-vapor lamp. Thus, the coating layer was cured. In turn, the coating layer was baked (heat-treated) at 120° C. for 15 minutes for dissipation of a generated acid, whereby a reaction was completed. In this manner, an over-cladding layer was formed. Thus, an optical waveguide (having a total thickness of 75 μm) was fabricated on the surface of the stainless steel substrate opposite from the electric circuit.

Formation of Light Reflection Portions

Opposite end portions of the optical waveguide disposed in association with the light transmission through-holes were cut by laser processing with an excimer laser (at a wavelength of 248 nm from a KrF light source) to be thereby formed with tilt surfaces tilted at 45 degrees with respect to the stainless steel substrate. Thereafter, the resulting product was ultrasonically cleaned in ethanol. Portions of the core present in the tilt surfaces were defined as light reflection portions.

Mounting of Light Emitting Element and Light Receiving Element

The resulting intermediate product formed with the light reflection portions was set on a stage of a mounting machine with its electric circuit facing up. Then, the alignment marks formed on the stainless steel substrate were visually detected through the alignment mark visual detection through-holes by an image detecting device provided in the mounting machine and, in this state, a light emitting element and a light receiving element were mounted to cover the light transmission through-holes with the optical axes of the light emitting element and the light receiving element being aligned with the positions of the light reflection portions of the core computed with reference to the alignment marks. Thus, the opto-electric hybrid board was produced.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An opto-electric hybrid board manufacturing method comprising the steps of:

preparing an electric circuit board;

fabricating an optical waveguide by forming an optical waveguide formation photosensitive resin layer on a surface opposite from a circuit formation surface of the electric circuit board and patterning a core formation region of the photosensitive resin layer by a photolithography method to form a core having a predetermined pattern;

mounting an optical element on a part of the circuit formation surface of the electric circuit board in association with an end of the optical waveguide;

forming a reflection portion on an end portion of the core located at the end of the optical waveguide, the reflection portion serving to reflect a light beam to permit light transmission between the core and the optical element; and forming a passage in the electric circuit board for the light transmission between the core and the optical element;

wherein a photosensitive resin layer including an alignment mark formation region in addition to the core formation region is used as the photosensitive resin layer, and the alignment mark formation region is patterned by the photolithography method to form an alignment mark having a predetermined pattern simultaneously with the formation of the core in the optical waveguide fabricating step;

wherein the optical element is mounted at a predetermined position with reference to the alignment mark in the optical element mounting step.

2. An opto-electric hybrid board manufacturing method as set forth in claim 1, wherein the optical element is a light emitting element which emits light toward the end portion of the core, and the reflection portion reflects the light emitted from the light emitting element.

3. An opto-electric hybrid board manufacturing method as set forth in claim 1, wherein the optical element is a light receiving element which receives light from the end portion of the core and the reflection portion reflects light from inside of the core.

4. An opto-electric hybrid board manufacturing method as set forth in claim 1, wherein the alignment mark serves as a reference mark which is visible through an alignment mark visual detection through-hole formed in the electric circuit board in the optical element mounting step.

5. An opto-electric hybrid board manufacturing method as set forth in claim 4, wherein the optical element is a light emitting element which emits light toward the end portion of the core, and the reflection portion reflects the light emitted from the light emitting element.

6. An opto-electric hybrid board manufacturing method as set forth in claim 4, wherein the optical element is a light receiving element which receives light from the end portion of the core and the reflection portion reflects light from inside of the core.

* * * * *